United States Patent
Hsu et al.

(10) Patent No.: US 11,133,188 B2
(45) Date of Patent: *Sep. 28, 2021

(54) NON-VOLATILE MEMORY SEMICONDUCTOR DEVICE WITH ELECTROSTATIC DISCHARGE PROTECTION, PLANARIZATION LAYERS, AND MANUFACTURING METHOD THEREOF

(71) Applicant: Taiwan Semiconductor Manufacturing Co., Ltd., Hsinchu (TW)

(72) Inventors: Yu-Ling Hsu, Tainan (TW); Hung-Ling Shih, Tainan (TW); Chieh-Fei Chiu, Tainan (TW); Po-Wei Liu, Tainan (TW); Wen-Tuo Huang, Tainan (TW); Yong-Shiuan Tsair, Tainan (TW); Shihkuang Yang, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/716,292

(22) Filed: Dec. 16, 2019

(65) Prior Publication Data

US 2020/0194266 A1 Jun. 18, 2020

Related U.S. Application Data

(62) Division of application No. 15/726,019, filed on Oct. 5, 2017, now Pat. No. 10,510,544.
(Continued)

(51) Int. Cl.
*H01L 21/28* (2006.01)
*H01L 29/423* (2006.01)
(Continued)

(52) U.S. Cl.
CPC .. *H01L 21/28123* (2013.01); *H01L 21/28141* (2013.01); *H01L 21/31053* (2013.01);
(Continued)

(58) Field of Classification Search
None
See application file for complete search history.

(56) References Cited

U.S. PATENT DOCUMENTS 7,183,608 B2    2/2007  Huang et al.
10,510,544 B2*  12/2019 Hsu ..................... H01L 23/3157
(Continued)

FOREIGN PATENT DOCUMENTS

DE  102015112267 A1  4/2016
JP      200654333 A   2/2006
(Continued)

OTHER PUBLICATIONS

Notice of Allowance issued in corresponding Korean Patent Application No. 10-2017-0155461, dated Sep. 19, 2019.
(Continued)

*Primary Examiner* — Lex H Malsawma
(74) *Attorney, Agent, or Firm* — McDermott Will & Emery LLP

(57) ABSTRACT

A method of manufacturing a non-volatile memory semiconductor device includes forming a plurality of memory cells on a non-volatile memory cell area of a semiconductor substrate, and forming a conductive layer over the plurality of memory cells. A first planarization layer of a planarization material having a viscosity of less than about 1.2 centipoise is formed over the plurality of memory cells. A planarization operation is performed on the first planarization layer and the conductive layer, thereby removing an upper region of the first planarization layer and an upper region of the conductive layer. Portions of a lower region of the conduc-
(Continued)

tive layer are completely removed between the memory cells.

20 Claims, 16 Drawing Sheets

Related U.S. Application Data

(60) Provisional application No. 62/427,761, filed on Nov. 29, 2016.

(51) Int. Cl.

| | | |
|---|---|---|
| *H01L 27/11521* | (2017.01) | |
| *H01L 45/00* | (2006.01) | |
| *H01L 23/31* | (2006.01) | |
| *H01L 27/24* | (2006.01) | |
| *H01L 21/3105* | (2006.01) | |
| *H01L 27/11531* | (2017.01) | |
| *H01L 27/11548* | (2017.01) | |

(52) U.S. Cl.
CPC ...... *H01L 23/3157* (2013.01); *H01L 23/3171* (2013.01); *H01L 27/11521* (2013.01); *H01L 27/11531* (2013.01); *H01L 27/2436* (2013.01); *H01L 29/42324* (2013.01); *H01L 29/42328* (2013.01); *H01L 45/04* (2013.01); *H01L 45/145* (2013.01); *H01L 45/1675* (2013.01); *H01L 27/11548* (2013.01); *H01L 2924/0002* (2013.01)

(56) References Cited

U.S. PATENT DOCUMENTS

| | | | |
|---|---|---|---|
| 2003/0107055 A1 | 6/2003 | Watanabe et al. | |
| 2003/0235953 A1* | 12/2003 | Sasago | H01L 27/115 438/257 |
| 2004/0027861 A1 | 2/2004 | Ryu et al. | |
| 2004/0065917 A1 | 4/2004 | Fan et al. | |
| 2006/0033138 A1 | 2/2006 | Fukada | |
| 2006/0138463 A1* | 6/2006 | Kim | H01L 27/105 257/202 |
| 2007/0096202 A1 | 5/2007 | Kang et al. | |
| 2008/0076688 A1 | 3/2008 | Barnes et al. | |
| 2009/0039410 A1 | 2/2009 | Liu et al. | |
| 2011/0127599 A1 | 6/2011 | Liu et al. | |
| 2013/0183829 A1 | 7/2013 | Xu et al. | |
| 2015/0084111 A1 | 3/2015 | Wu et al. | |
| 2015/0179817 A1 | 6/2015 | Fang et al. | |
| 2015/0287798 A1 | 10/2015 | Hsiao et al. | |
| 2015/0348987 A1 | 12/2015 | Lee et al. | |
| 2015/0349095 A1 | 12/2015 | Yap et al. | |
| 2016/0013198 A1 | 1/2016 | Liu | |
| 2016/0020219 A1 | 1/2016 | Chuang et al. | |
| 2016/0035739 A1 | 2/2016 | Saito et al. | |
| 2016/0163722 A1* | 6/2016 | Chang | H01L 27/11521 257/316 |
| 2016/0254164 A1 | 9/2016 | Sugishima et al. | |
| 2016/0372456 A1 | 12/2016 | Yoo et al. | |
| 2016/0372593 A1* | 12/2016 | Yoo | H01L 29/0847 |

FOREIGN PATENT DOCUMENTS

| | | |
|---|---|---|
| KR | 20030036111 A | 5/2003 |
| KR | 20050002351 A | 1/2005 |
| KR | 100784860 B1 | 12/2007 |
| KR | 20080009429 A | 1/2008 |
| TW | 201117270 A1 | 5/2011 |
| TW | I532151 B | 5/2016 |
| TW | I555206 B | 10/2016 |

OTHER PUBLICATIONS

Non-final Office Action issued in U.S. Appl. No. 15/726,019, dated Oct. 4, 2018.
Final Office Action issued in U.S. Appl. No. 15/726,019, dated May 15, 2019.
Notice of Allowance issued in U.S. Appl. No. 15/726,019, dated Aug. 28, 2019.

* cited by examiner

NON-VOLATILE MEMORY SEMICONDUCTOR DEVICE WITH ELECTROSTATIC DISCHARGE PROTECTION, PLANARIZATION LAYERS, AND MANUFACTURING METHOD THEREOF

CROSS-REFERENCE TO RELATED APPLICATIONS

This application is a divisional of U.S. patent application Ser. No. 15/726,019 filed Oct. 5, 2017, now U.S. Pat. No. 10,510,544, which claims priority to U.S. Provisional Patent Application 62/427,761 filed Nov. 29, 2016, the entire disclosures of each of which are incorporated herein by reference.

TECHNICAL FIELD

The disclosure relates to semiconductor integrated circuits, more particularly to semiconductor devices including non-volatile memory cells, and manufacturing processes thereof.

BACKGROUND

As the semiconductor industry has progressed into nanometer technology process nodes in pursuit of higher device density, higher performance, and lower costs, there have been challenges in reducing topography variations and suppressing an increase in the number of lithography operations. Effective planarization during the manufacturing process is desired to increase device density. Edge thinning of planarization materials is a problem in semiconductor device manufacturing processes, particularly in devices in which there is large component density or topography variations.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

In the embodiments of the present disclosure, a semiconductor device includes non-volatile memory (NVM) cells and peripheral circuits such as logic circuits. The NVM cells generally require a stacked structure in which plural conductive layers, such as polysilicon layers, are stacked. Further, various planarization operations, such as an etch-back operation or a chemical mechanical polishing (CMP) operation, are performed to form desired layers or patterns of the NVM cells. Low viscosity planarization material is used in embodiments of the present disclosure. The low viscosity planarization material allows NVM semiconductor devices having reduced size to be formed because the low viscosity planarization material allows a conformal edge portion to be formed without using a dam structure without using a dam structure, such as a guard ring structure, which takes up space on the semiconductor substrate.

Figure 1:
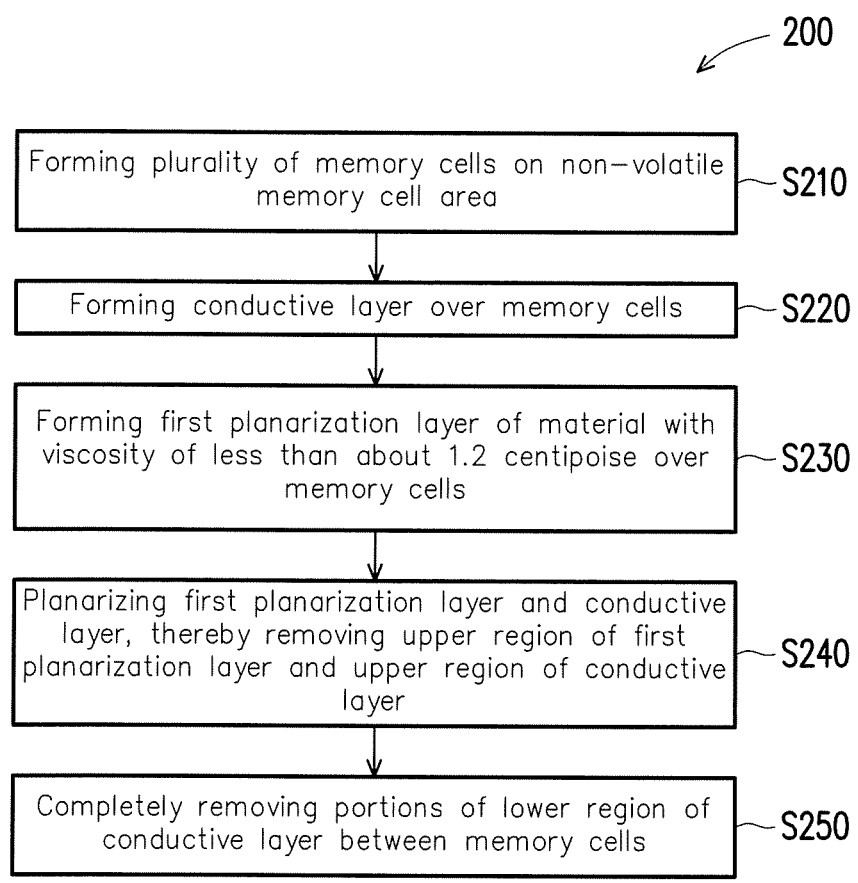
FIG. 1 is a flowchart showing the steps of a method of manufacturing a non-volatile memory semiconductor device.

A flowchart 200 showing the steps of a method of manufacturing a non-volatile memory semiconductor device according to an embodiment of the disclosure is illustrated in FIG. 1. In a first step S210 in the method, an operation of forming a plurality of memory cells on a non-volatile memory cell area is performed. In step S220, a conductive layer is formed over the memory cells, and first planarization layer of a planarization material having a viscosity of less than about 1.2 centipoise is formed over the memory cells in step S230. A planarizing operation is subsequently performed in step S240 to remove an upper region of the first planarization layer and an upper region of the conductive layer. Then portions of a lower region of the conductive layer between the memory cells are completely removed in step S250. Methods of manufacturing non-volatile memory semiconductor devices according to embodiments of the disclosure are discussed in further detail herein.

FIGS. 2A-13 generally show exemplary cross sectional views illustrating a sequential process for manufacturing a semiconductor device including non-volatile memory cells according to one embodiment of the present disclosure. It is understood that additional operations can be provided before, during, and after processes shown by FIGS. 2A-13, and some of the operations described below can be replaced or eliminated, for additional embodiments of the method. Some elements may not be illustrated for simplicity. The order of the operations may be changeable.

Figure 2A:
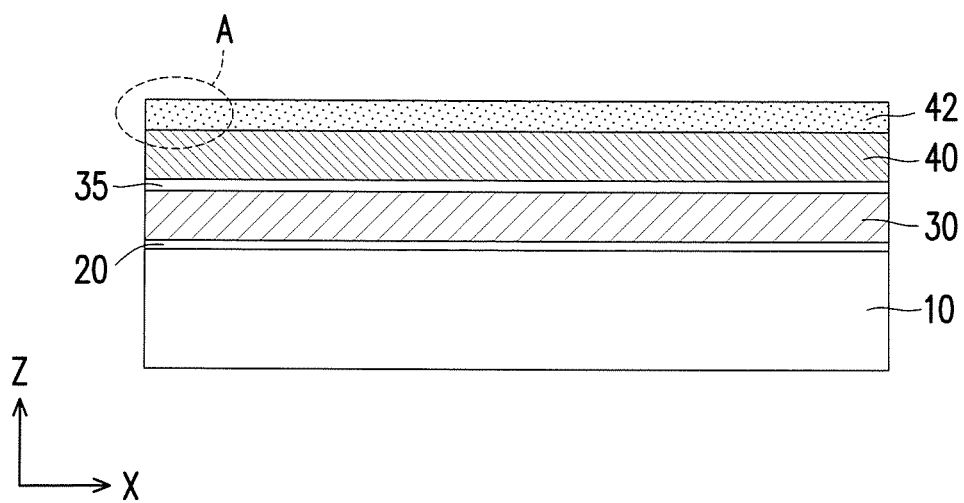
FIG. 2A shows an exemplary cross sectional view illustrating one of the various stages of a sequential semiconductor device manufacturing process according to some embodiments of the present disclosure.

As shown in FIG. 2A, a first dielectric layer 20, which is to be used as a tunnel dielectric layer of the NVM cells, is formed on a substrate 10, and a first conductive layer 30, which is to be used as a floating gate of the NVM cell, is formed over the first dielectric layer 20. Further, a second dielectric layer 35, a second conductive layer 40, which is to be used as a control gate of the NVM cell, and a mask layer (cap insulating layer) 42 are sequentially formed over the first conductive layer.

In some embodiments, the substrate 10 is, for example, a p-type silicon substrate with an impurity concentration in a range from about $1 \times 10^{15}$ cm$^{-3}$ to about $1 \times 10^{18}$ cm$^{-3}$. In other embodiments, the substrate is an n-type silicon substrate with an impurity concentration in a range from about $1 \times 10^{15}$ cm$^{-3}$ to about $1 \times 10^{18}$ cm$^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate is a silicon layer of an SOI (silicon-on-insulator) substrate.

The first dielectric layer 20 utilized as a tunnel oxide layer for NVM cells is made of silicon oxide in some embodiments. The thickness of the first dielectric layer 20 is in a range from about 1 nm to about 50 nm in some embodiments. The first dielectric layer 20 can be formed by thermal oxidation or chemical vapor deposition (CVD).

The first conductive layer 30 is polysilicon in some embodiments. In other embodiments the first conductive layer is any suitable metal or metal nitride for use as a gate electrode. The first conductive layer 30 can be formed by CVD. The thickness of the first conductive layer 30 as deposited is in a range from about 20 nm to about 200 nm in some embodiments. In some embodiments, the thickness of the first conductive layer 30 is reduced by a planarization operation, such as chemical-mechanical polishing (CMP) or an etch-back method. After the planarization operation, the thickness of the first conductive layer 30 is in a range from about 10 nm to about 50 nm in some embodiments. When the first conductive layer 30 is polysilicon, the polysilicon is appropriately doped with impurities. In certain embodiments, the first conductive layer 30 is an amorphous silicon layer.

The second dielectric layer 35 includes a silicon oxide layer, a silicon nitride layer or multilayers of silicon oxide and silicon nitride in some embodiments. In one embodiment, a silicon oxide-silicon nitride-silicon oxide (ONO) layer is used as the second dielectric layer 35. The thickness of the second dielectric layer is in a range from about 1 nm to about 100 nm in some embodiments. The second dielectric layer 35 can be formed by CVD, physical vapor deposition (PVD) or atomic layer deposition (ALD).

The second conductive layer 40 can be a polysilicon layer formed by CVD, and the thickness of the second conductive layer 40 is in a range from about 10 nm to about 100 nm, in some embodiments.

Figure 2B:
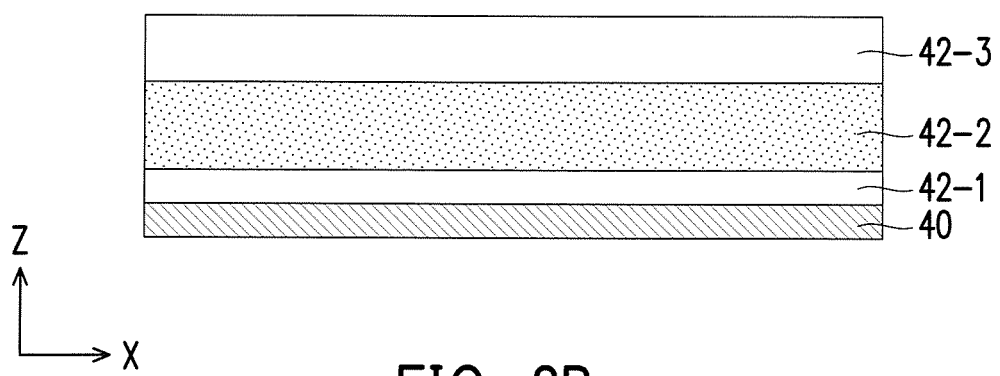
FIG. 2B is a cross-sectional view of detail A in FIG. 2A.

The hard mask layer 42 is made of silicon oxide formed by CVD, and the thickness thereof is in a range from about 10 nm to about 200 nm. In some embodiments, the hard mask layer 42 includes three layers, as shown in FIG. 2B, an enlarged view of detail A in FIG. 2A, for example, a lower layer 42-1 made of silicon oxide, a middle layer 42-2 made of silicon nitride and an upper layer 42-3 made of silicon oxide. In other embodiments, the lower layer 42-1 is made of silicon nitride, the middle layer 42-2 is made of silicon oxide, and the upper layer 42-3 is made of silicon nitride. In certain embodiments, the middle layer is made of different material than the lower and upper layers. The thickness of the lower layer 42-1 is in a range of about 2 nm to about 10 nm, the thickness of the middle layer 42-2 is in a range of about 5 nm to about 100 nm, and the thickness of the upper layer 42-3 is in a range of about 2 nm to about 50 nm, in some embodiments.

Figure 3:
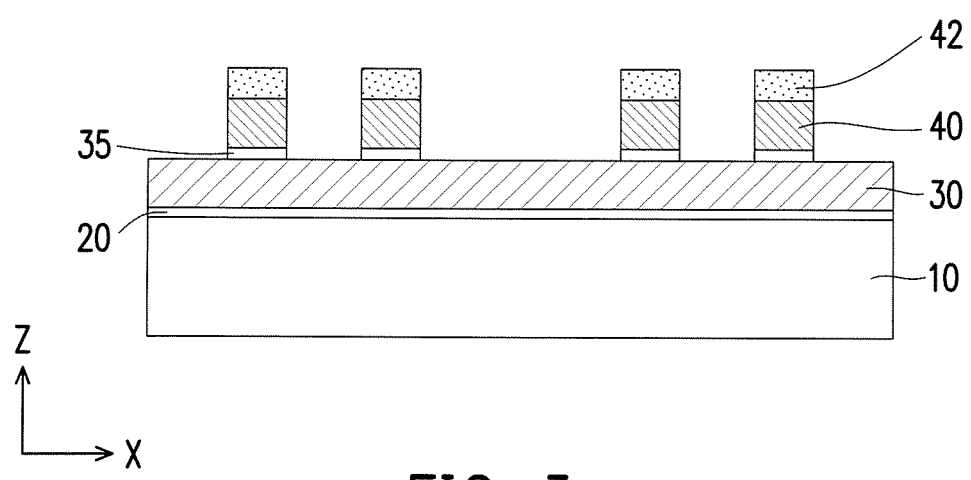
FIG. 3 shows an exemplary cross sectional view illustrating one of the various stages of a sequential semiconductor device manufacturing process according to some embodiments of the present disclosure.

Next, by using a patterning operation including lithography and etching, the hard mask layer 42 is patterned, and by using the patterned hard mask layer as an etching mask, the second conductive layer 40 and the second dielectric layer 35 are patterned as shown in FIG. 3.

Figure 4A:
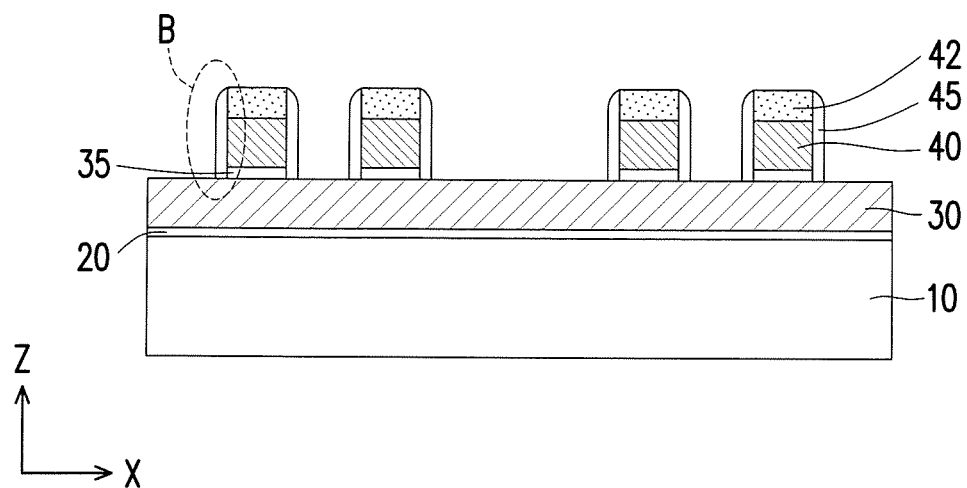
FIG. 4A shows an exemplary cross sectional view illustrating one of the various stages of a sequential semiconductor device manufacturing process according to some embodiments of the present disclosure.

After the patterning operation of the second conductive layer 40 and the second dielectric layer 35, first sidewall spacers 45 are formed on opposing sides of the patterned second conductive layer 40 and second dielectric layer 35, as shown in FIG. 4A.

The first sidewall spacers 45 are made of one or more layers of suitable dielectric material. One or more blanket layers of dielectric material are formed, for example by CVD, over the entire substrate and then anisotropic etching is performed, thereby forming the first sidewall spacers 45. The thickness of the first sidewall spacers 45 is in a range from about 1 nm to about 20 nm in some embodiments.

Figure 4B:
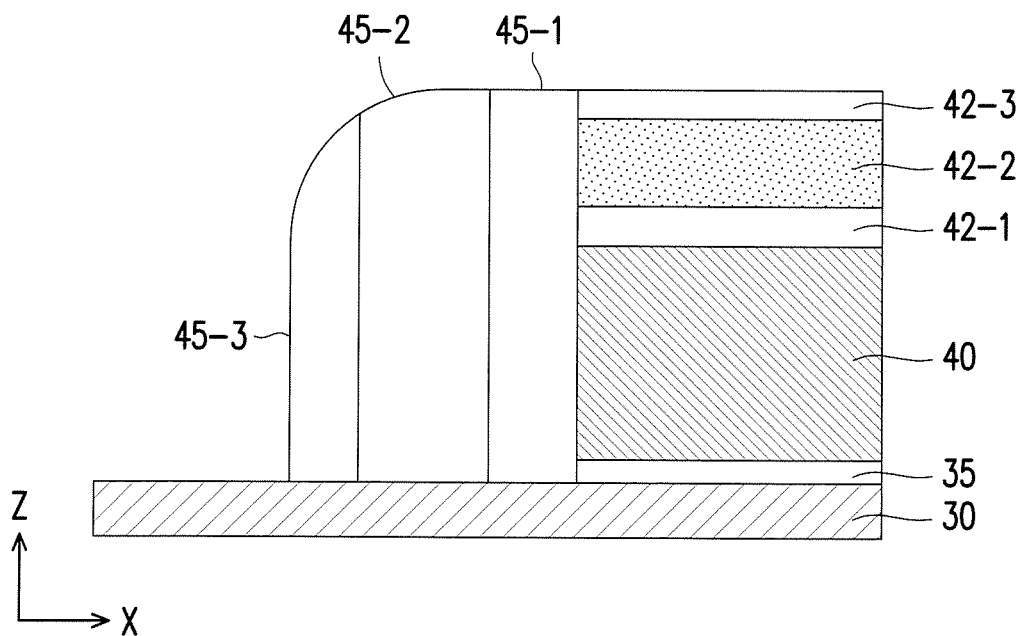
FIG. 4B is a cross-sectional view of detail B in FIG. 4A.

In some embodiments, the first sidewall spacers 45 include an ONO film having a silicon nitride layer 45-2 sandwiched by two silicon oxide layers 45-1 and 45-3, as shown in FIG. 4B, which is an enlarged view of detail B in FIG. 4A. The thicknesses of the silicon oxide layer 45-1, the silicon nitride layer 45-2 and the silicon oxide layer 45-3 are in ranges of about 1-20 nm, about 1-30 nm and about 1-20 nm, respectively, in some embodiments. In certain embodiments, the first sidewall spacers 45 are made of a single layer of silicon nitride or silicon oxynitride.

Figure 5:
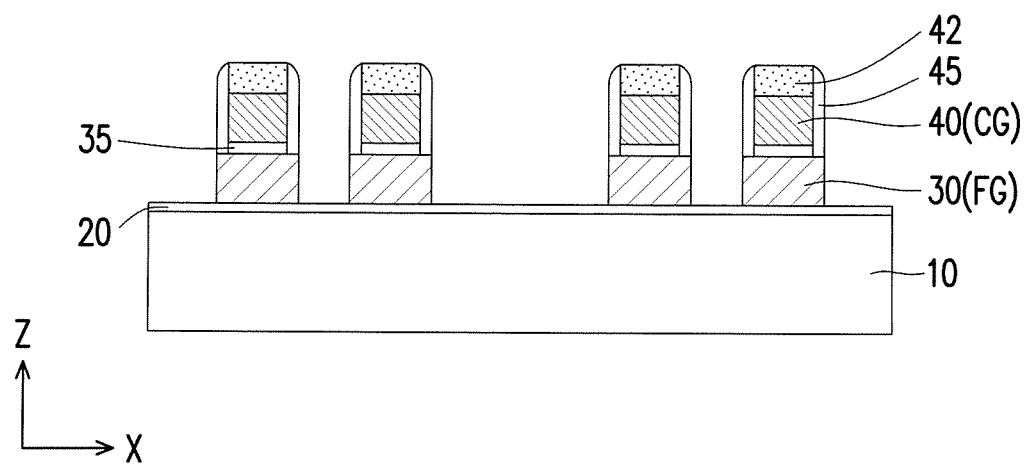
FIG. 5 shows an exemplary cross sectional view illustrating one of the various stages of a sequential semiconductor device manufacturing process according to some embodiments of the present disclosure.

After the first sidewall spacers 45 are formed, the first polysilicon layer 30 is patterned by using dry etching operations, as shown in FIG. 5.

Figure 6:
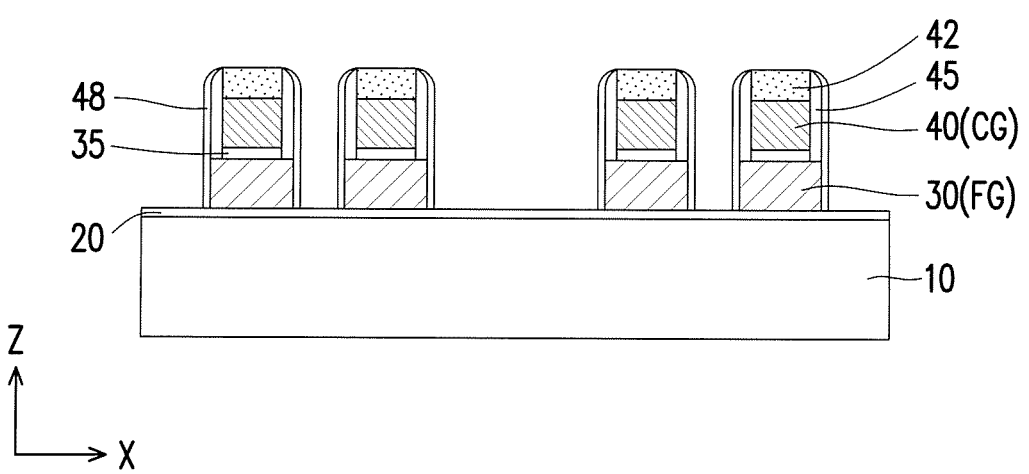
FIG. 6 shows an exemplary cross sectional view illustrating one of the various stages of a sequential semiconductor device manufacturing process according to some embodiments of the present disclosure.
Figure 7:
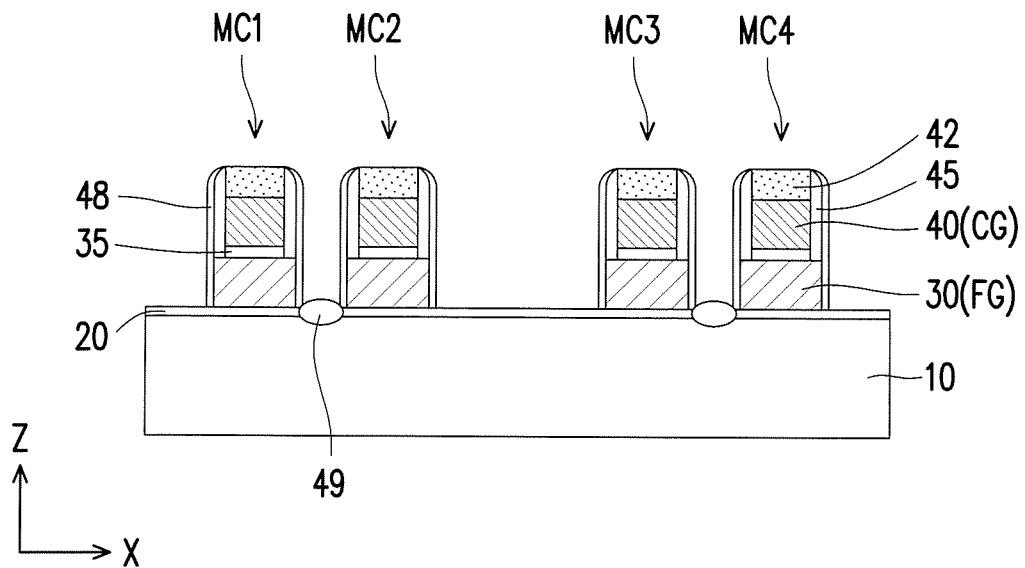
FIG. 7 shows an exemplary cross sectional view illustrating one of the various stages of a sequential semiconductor device manufacturing process according to some embodiments of the present disclosure.

Further, second sidewall spacers 48 are formed as shown in FIG. 6, and an erase-gate oxide 49 is formed as shown in FIG. 7. The second sidewall spacers 48 are made of one or more layers of dielectric material. In one embodiment, the second sidewall spacers 48 are made of silicon oxide formed by CVD. The erase-gate oxide 49 is made of silicon oxide. In some embodiments, a silicon oxide layer is formed and then the silicon oxide layer is patterned to remove the silicon oxide layer from an erase gate area, and then wet oxidation is performed, thereby forming the erase-gate oxide 49. In certain embodiments, a gate dielectric layer for select gates (word line) is also formed. In some embodiments, the first dielectric layer 20 remains as the gate dielectric layer, and in certain embodiments, exposed portions of the first dielectric layer 20 to be used as the gate dielectric layer for the select gates is thinned.

By the foregoing operations, stacked structures MC1, MC2, MC3, and MC4 are formed as shown in FIG. 7. The stacked structures MC1 and MC2 are to be a pair of memory cells and the stacked structures MC3 and MC4 are to be another pair of memory cells. The distance between the stacked structures MC1 and MC2 is equal to the distance between the stacked structures MC3 and MC4, and less than the distance between the stacked structures MC2 and MC3.

Figure 8:
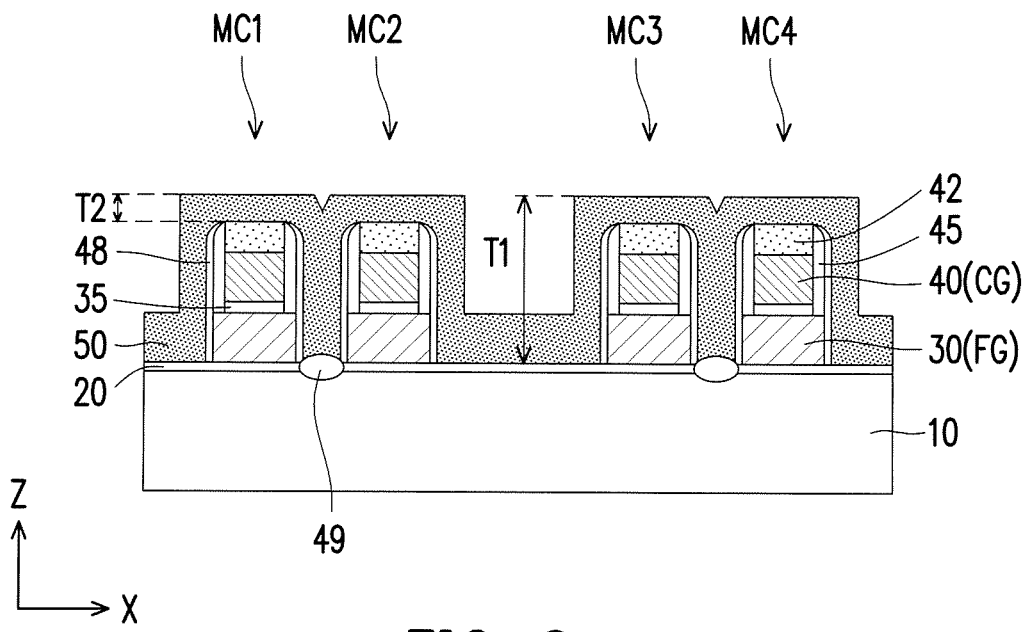
FIG. 8 shows an exemplary cross sectional view illustrating one of the various stages of a sequential semiconductor device manufacturing process according to some embodiments of the present disclosure.

Then, as shown in FIG. 8, a third conductive layer 50 is formed over the structure of FIG. 7. The third conductive layer 50 is a polysilicon layer in some embodiments. The third conductive layer 50 may be formed by the same processes as the first and second conductive layers 30, 40. The third conductive layer 50 is conformally formed by CVD in some embodiments, as shown in FIG. 8, and a large gap (low height portion) is formed between the stacked structures MC2 and MC3. The thickness T1 of the third conductive layer 50 measured at a flat surface from an upper surface of the first dielectric layer 20 to an uppermost surface of the third conductive layer 50 is in a range from about 40 nm to about 200 nm in some embodiments. In certain embodiments, the thickness T2 of the third conductive layer 50 from an upper surface of the hard mask layer 42 to an uppermost surface of the third conductive layer 50 is in a range from about 20 nm to about 100 nm. In some embodiments, a ratio of the thicknesses T1/T2 ranges from about 10/1 to about 2/1.

Figure 9:
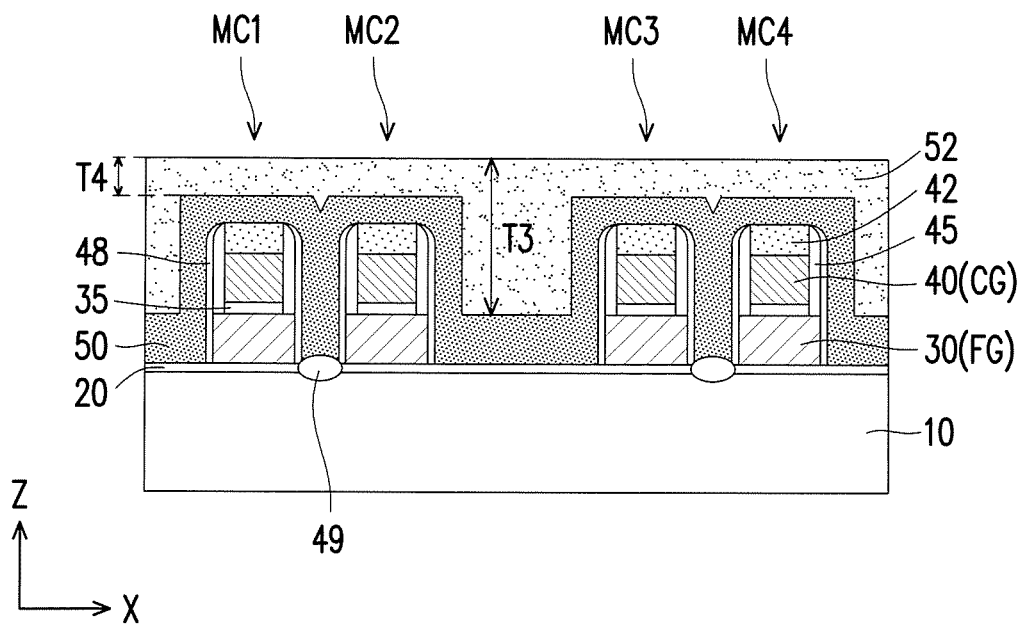
FIG. 9 shows an exemplary cross sectional view illustrating one of the various stages of a sequential semiconductor device manufacturing process according to some embodiments of the present disclosure.

As shown in FIG. 9, a first planarization layer 52 is subsequently formed over the third conductive layer 50. The thickness T3 of the first planarization layer 52 measured at a lower flat portion of the third conductive layer 50 between stacked structures MC2 and MC3 is in a range from about 60 nm to about 300 nm in some embodiments. In certain embodiments, the thickness T4 of the first planarization layer 52 measured at the top of the third conductive layer 50 where the third conductive layer 50 overlies the hard mask layer 42 is in a range from about 20 nm to about 50 nm. After the first planarization layer 52 is formed the height of the stacked structure is about 200 nm to about 400 nm in some embodiments. In some embodiments, a ratio of the thicknesses T3/T4 ranges from about 15/1 to about 3/1.

In some embodiments, the first planarization layer 52 is made of organic material, such as a carbon backbone polymer, having low viscosity. In certain embodiments, the first planarization layer 52 is made of a planarization layer material having a viscosity of less than about 1.2 centipoise. In some embodiments, the planarization layer material is an aromatic resin/propylene glycol monomethyl ether acetate material, such as JSR NFC HM8088-7, available from JSR Corporation. The low viscosity allows the planarization layer to evenly spread and form a smooth, flat surface over the stacked structures and valleys in between the pairs of stacked features. When the viscosity of the planarization layer material is greater than 1.2 centipoise multiple applications of the planarization material may be required to achieve complete coverage, lengthening the amount of time required to form the planarization layer. Further, the higher viscosity material may not evenly flow over the entire surface of the device being planaraized, leading to edge-thinning of the planarization at edges of device. In addition, the use of the higher viscosity planarization material my necessitate the use of dam structure to ensure planarity, thereby increasing the size of the semiconductor device. In some embodiments, a baking operation is performed applying the planarization material to cure the planarization layer 52.

Figure 10:
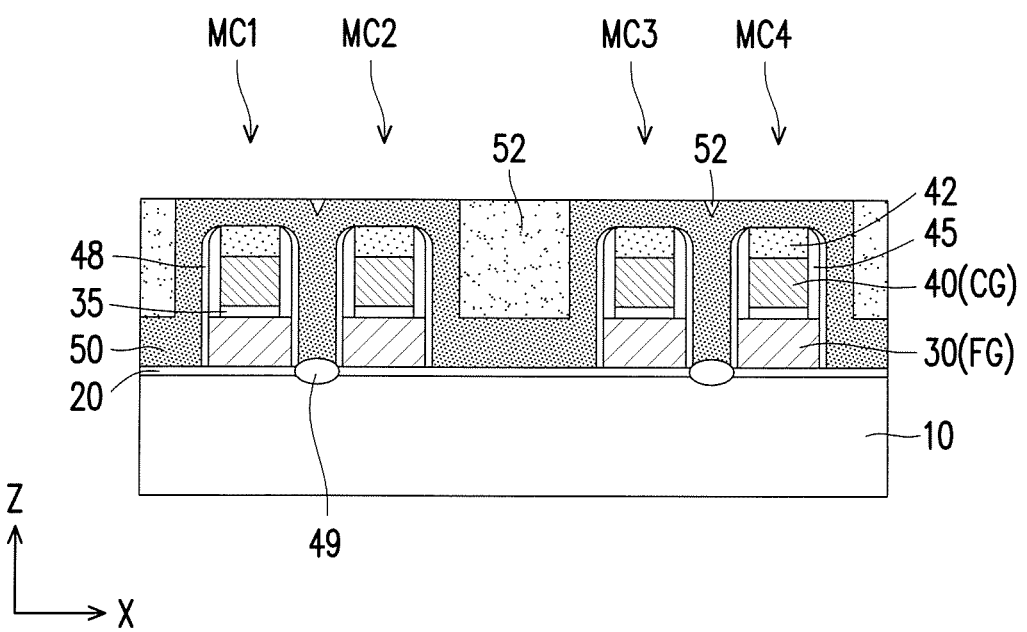
FIG. 10 shows an exemplary cross sectional view illustrating one of the various stages of a sequential semiconductor device manufacturing process according to some embodiments of the present disclosure.

Then, as shown in FIG. 10, a planarization operation is performed to remove an upper region of the planarization layer 52 and an upper region of the third conductive layer 50. In some embodiments, suitable planarization operations include chemical-mechanical polishing (CMP) or an etch-back operation using suitable wet etching or dry etching techniques. In some embodiments, a plasma dry etching operation is used.

Figure 11:
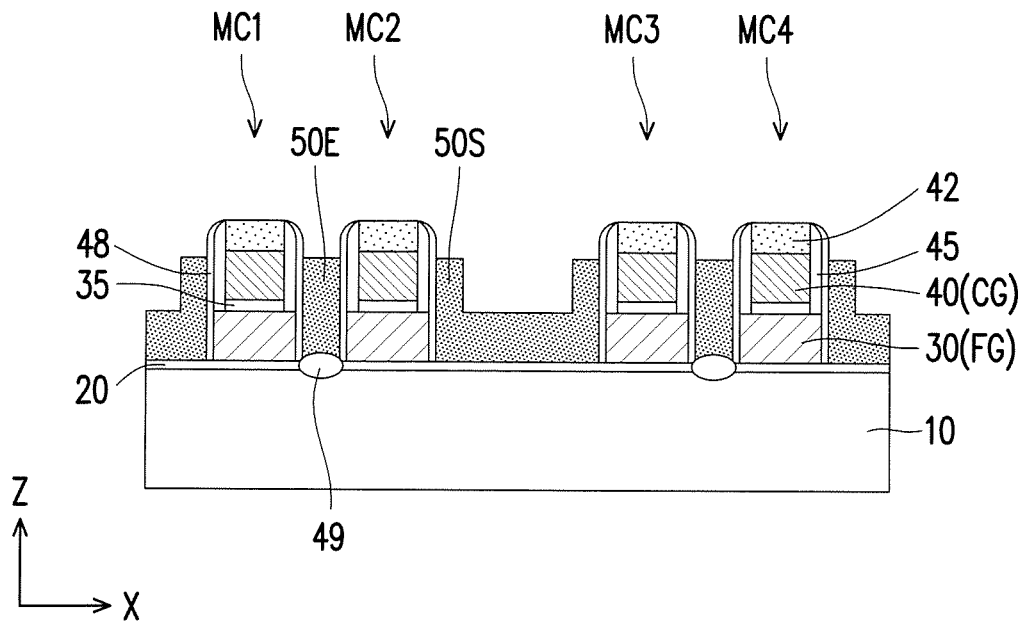
FIG. 11 shows an exemplary cross sectional view illustrating one of the various stages of a sequential semiconductor device manufacturing process according to some embodiments of the present disclosure.

After the first etch-back operation, a second etch back operation is performed to further reduce the thickness of the third conductive layer 50, as shown in FIG. 11, and the first planarization layer 52 is completely removed in some embodiments. By the second etch-back operation, an erase gate 50E and a select gate (word line) 50S are formed.

As shown in FIG. 11, the erase gate 50E is disposed between a pair of stacked structures MC1, MC2 and the select gate 50S are disposed on the opposing sides of the pair of stacked structures where the erase gate 50E is not formed. As shown in FIG. 11, it is noted that at this stage of the manufacturing process, the select gate of one pair of the stacked structures MC1, MC2 is connected to (not divided from) the select gate of an adjacent of the pair of the stacked structures (MC3) as shown in FIG. 11.

Figure 12:
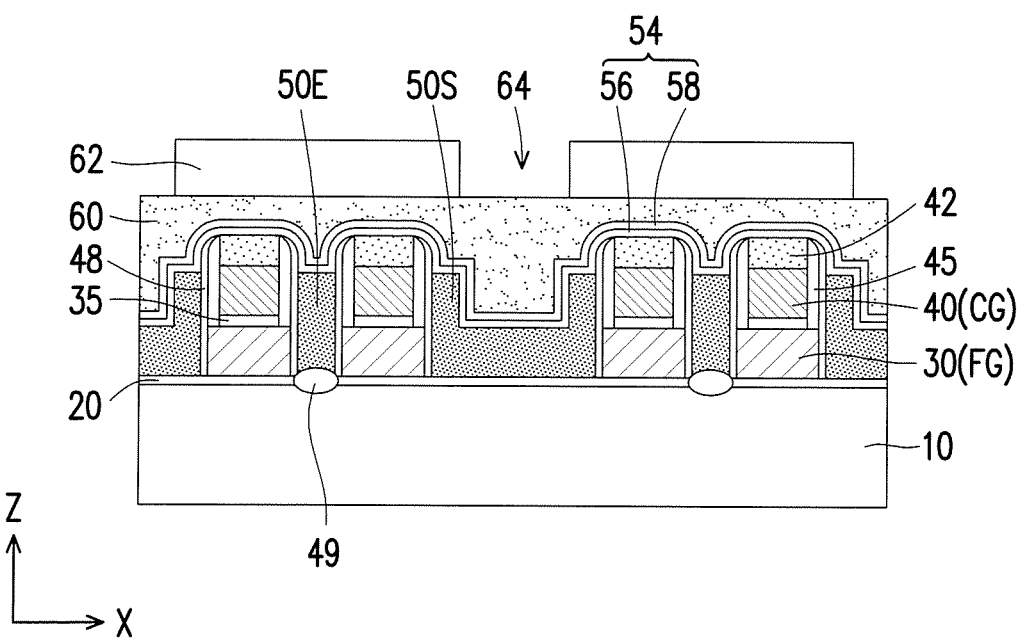
FIG. 12 shows an exemplary cross sectional view illustrating one of the various stages of a sequential semiconductor device manufacturing process according to some embodiments of the present disclosure.

As shown in FIG. 12, after the select gates 50S and the erase gates 50E are formed by etching the third conductive layer 50, a hard mask 54 is formed over the structure of FIG. 11 by forming a first hard mask layer 56 and a second hard mask layer 58 over the first hard mask layer 56. In some embodiments, the first hard mask layer 56 is made of a silicon oxide based dielectric material, such as silicon dioxide, and the second hard mask layer 58 is made of a silicon nitride based dielectric material, such as SiN or SiON.

Further, as shown in FIG. 12, a second planarization layer 60 is formed over the hard mask 54. In some embodiments, the second planarization layer 60 is formed of the same material as the first planarization layer 52, such as a carbon backbone polymer material having a viscosity of less than about 1.2 centipoise. In other embodiments, the second planarization layer 60 is a different material than the first planarization layer 52. In certain embodiments, the second planarization layer 60 is a higher viscosity material than the first planarization layer 52. A photoresist layer 62 is subsequently formed over the second planarization layer 60, and the photoresist is patterned to form openings 64 over the structure of FIG. 11.

Figure 13:
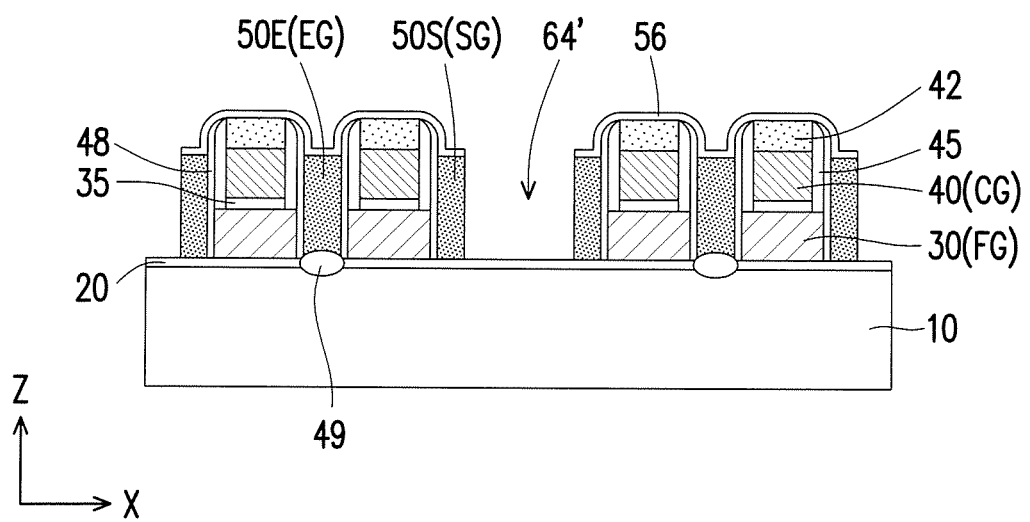
FIG. 13 shows an exemplary cross sectional view illustrating one of the various stages of a sequential semiconductor device manufacturing process according to some embodiments of the present disclosure.

By using the resist pattern 62 as an etching mask, the first and second hard mask layers 56, 58 are patterned, and then the third conductive layer 50 is patterned, such as by etching, to remove a portion of the lower region of the third conductive layer 50, thereby separating the select gates by an opening 64', as shown in FIG. 13. During and/or after the etching of the third conductive layer 50, the second hard mask layer 56 is removed, and the second planarization layer 62 is completely removed.

It is understood that the structure shown in FIG. 13 undergoes further CMOS processes to form various features such as interconnect vias, interconnect metal layers, passivation layers, etc.

FIGS. 14A-14D show exemplary cross sectional views of the non-volatile memory cell area and logic area of a semiconductor device illustrating sequential stages of the manufacturing process according to some embodiments of the present disclosure. FIGS. 14A-14D also illustrate embodiments where the hard mask layer 42 includes three layers, for example, a lower layer 42-1 made of silicon oxide, a middle layer 42-2 made of silicon nitride and an upper layer 42-3 made of silicon oxide, and the first sidewall spacers 45 include an ONO film having a silicon nitride layer 45-2 sandwiched by two silicon oxide layers 45-1 and 45-3. In other embodiments, the lower layer 42-1 is made of silicon nitride, the middle layer 42-2 is made of silicon oxide, and the upper layer 42-3 is made of silicon nitride.

Figure 14A:
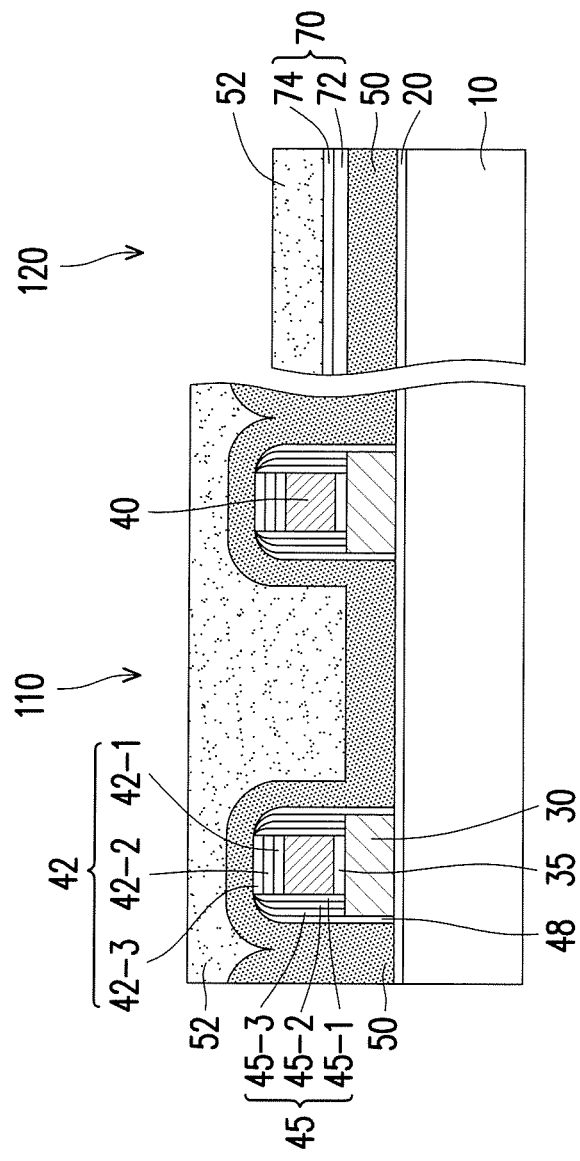
FIGS. 14A, 14B, 14C, and 14D show exemplary cross sectional views of the non-volatile memory cell area and logic area of a semiconductor device illustrating sequential stages of the manufacturing process according to some embodiments of the present disclosure.

As shown in FIG. 14A, the first planarization layer 52 is formed over the NVM cell area 110 and the logic area 120. A hard mask layer 70 including a nitride layer 72 and an oxide layer 74 is formed over the third conductive layer 50 in the logic area 120 to protect the third conductive layer 50 in the logic area 120 during subsequent etching of the third conductive layer 50 in the NVM cell area 110.

Figure 14B:
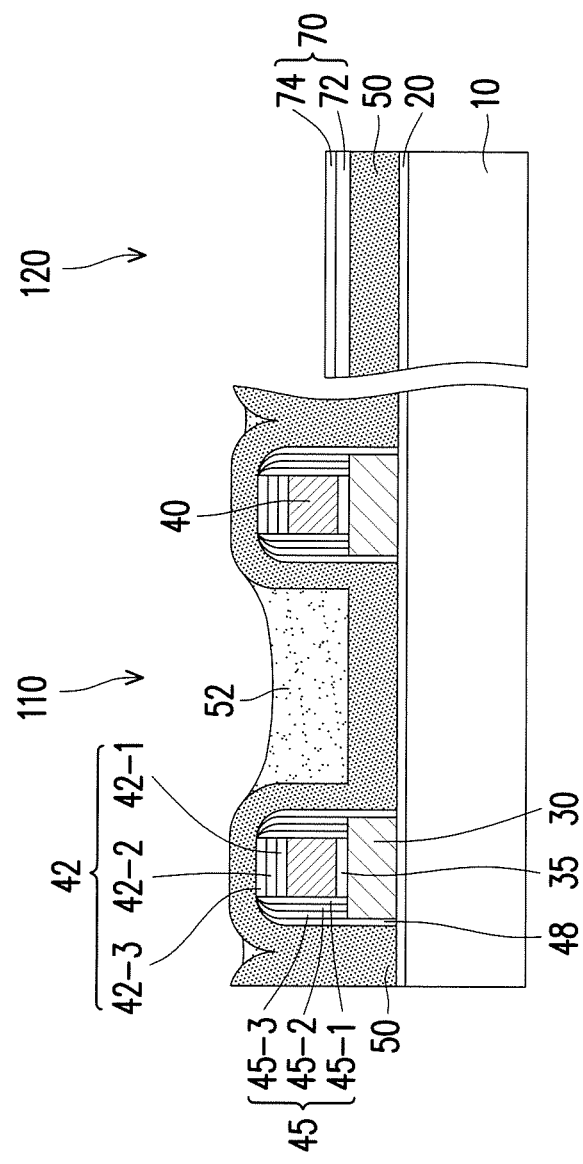

Then, as shown in FIG. 14B, a first etch-back operation is performed to remove an upper portion of the third polysilicon layer 50 the first planarization layer 52 in the NVM cell area 110 and the first planarization layer 52 in the logic area 120, by using plasma dry etching.

Figure 14C:
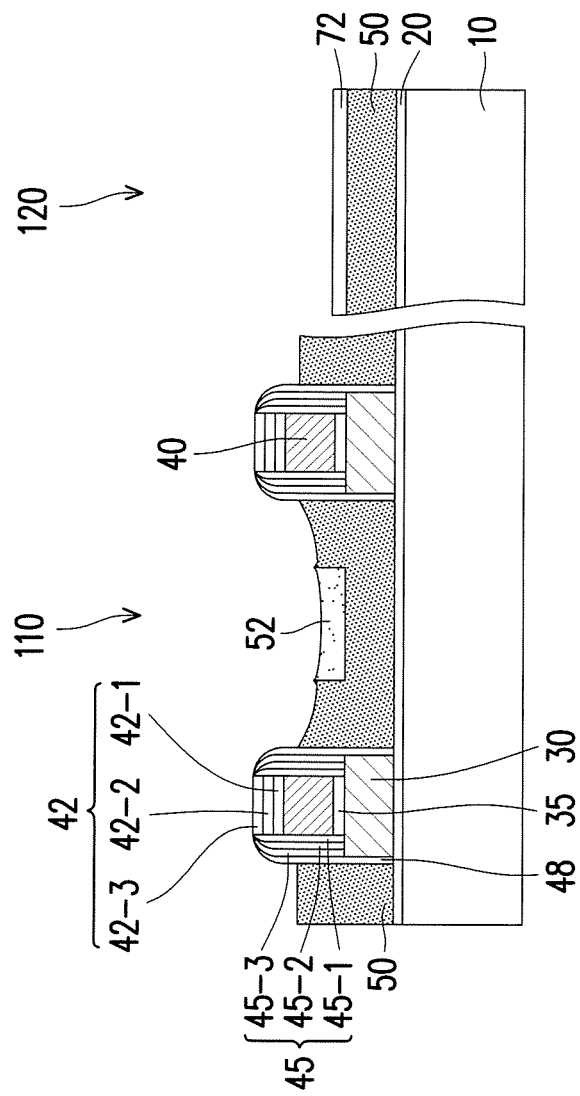
Figure 14D:
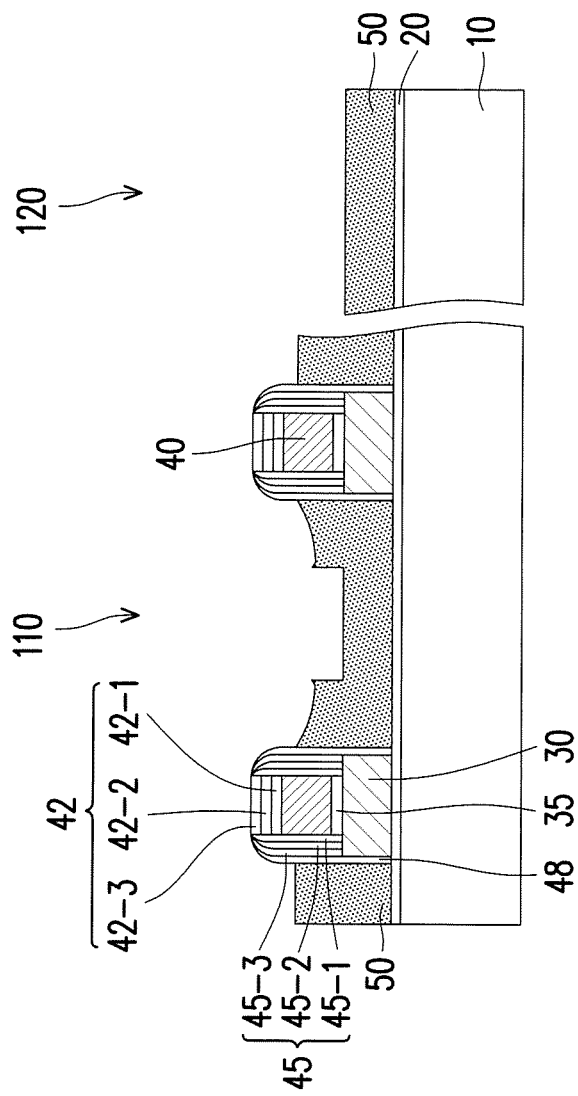

After the first etch-back operation, a second etch back operation is performed to further reduce the thickness of the third conductive layer 50 in the NVM cell area 110 and the oxide layer 72 in the logic area 120, as shown in FIG. 14C. The nitride layer 72 is subsequently removed from over the third conductive layer 50 in the logic area 120 and any remaining first planarization layer 52 from the NVM cell area 110, as shown in FIG. 14D. The nitride layer 72 and any remaining first planarization layer 52 are removed by suitable dry etching or wet etching techniques. In some embodiments, the nitride layer 72 is removed using a hot phosphoric acid etching operation. In some embodiments, any remaining first planarization layer 52 is removed using a piranha etch (sulfuric acid and hydrogen peroxide) or an oxygen plasma etch.

Figure 15:
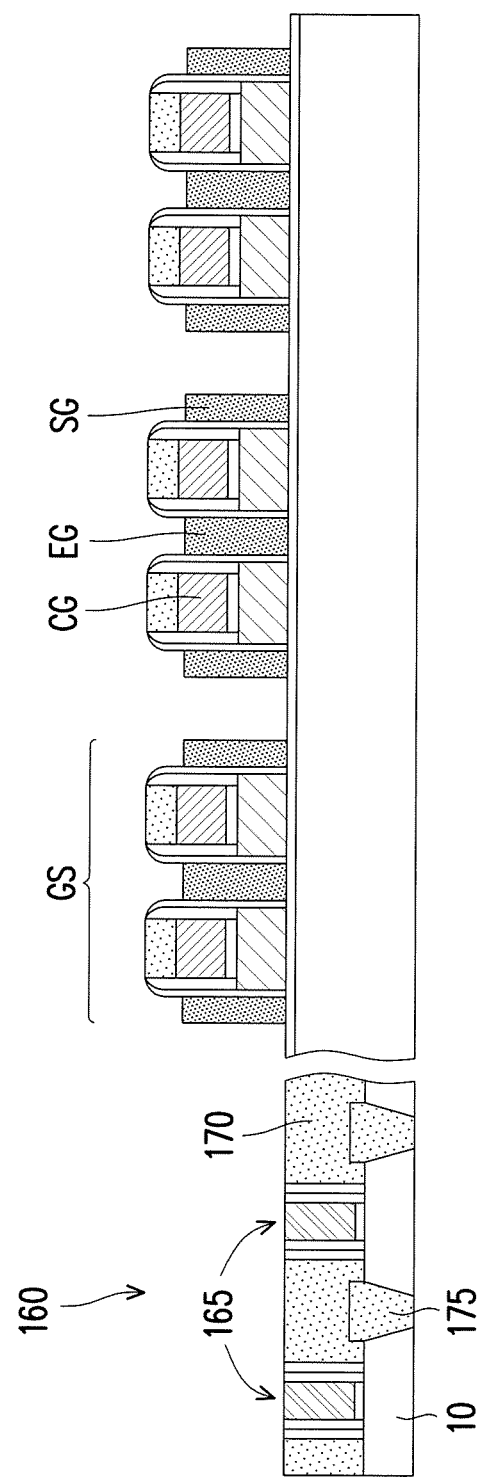
FIG. 15 shows an exemplary cross sectional view of a semiconductor device formed according to the present disclosure.

FIG. 15 shows an exemplary cross sectional view of a semiconductor device according to an embodiment of the present disclosure having an NVM cell area and a logic area. As shown, a non-volatile memory array according to some embodiments of the disclosure, include a plurality of pairs of gates structures (GS). The gate structures GS include a pair of control gates (CG) with an erase gate (EG) between the control gates (CG). A pair of select gates (SG) are formed on each side of the control gates (CG) in some embodiments. In addition a pair floating gates (FG) is formed beneath each control gate (CG). Three gate structures (GS) are shown in this embodiment, but the NVM cell area is not limited to three gate structures, and some embodiments include fewer or a greater number of gate structures.

The logic area 160 includes one or more gate electrode structures 165 surrounded by an interlayer dielectric layer 170 and separated by shallow trench isolation regions 175 formed in the substrate 10 in some embodiments.

Figure 16:
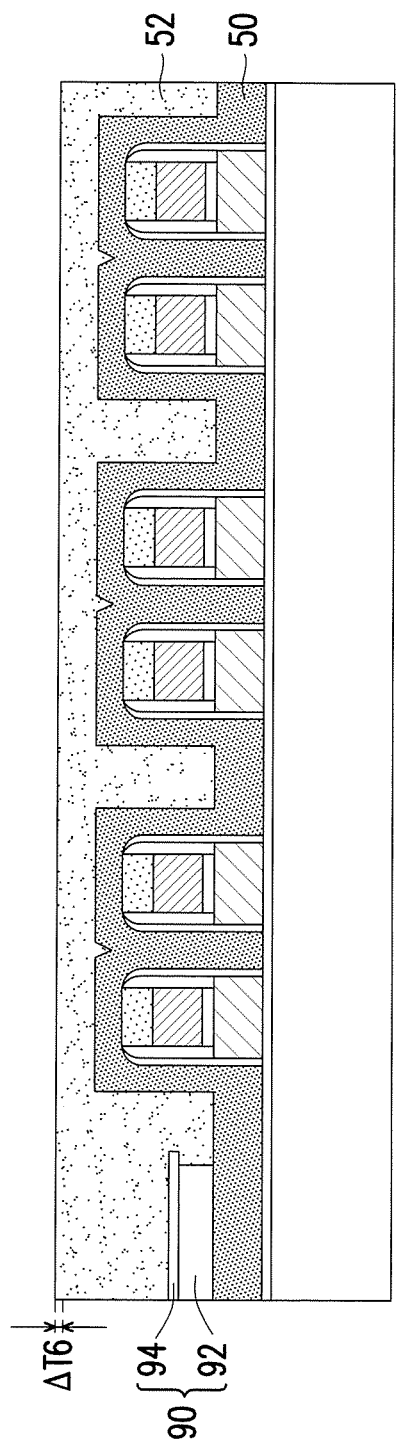
FIG. 16 shows an exemplary cross sectional view of one of the various stages of a semiconductor device manufacturing process according to the present disclosure.

FIG. 16 shows an exemplary comparison cross sectional view of one of the various stages of a semiconductor device manufacturing process according to the present disclosure.

A high viscosity planarization material has a viscosity greater than about 1.2 centipoise. The high viscosity planarization material may have a viscosity of greater than 2 centipoise. A low viscosity planarization material has a viscosity of less than about 1.2 centipoise. A dielectric layer 90, may be formed at the edge of an NVM cell area. In some embodiments, the dielectric layer 90 includes an oxide layer 94 overlying a nitride layer 92. The dielectric layer is disposed on a conductive layer, such as a polysilicon layer 50.

In a case where the high viscosity planarization material is used as a planarization material during the manufacturing process, edge thinning of the high viscosity planarization material may occur because of high viscosity planarization material reflow problems. The viscosity of the high viscosity planarization material can cause uneven flow of the planarization material and the high viscosity planarization materials may have to be applied in several stages, thereby lengthening the time duration of the coating operation. Because of the high viscosity planarization material reflow issues, there may be a difference in height of the high viscosity planarization material $\Delta T5$ between the edge area and the area overlying the NVM gate structures.

Embodiments of the present disclosure, however, use a low viscosity planarization material having a viscosity of less than 1.2 centipoise for the planarization layer 52, instead of a high viscosity material. The low viscosity planarization layer 52 has a flat top surface, as shown in FIG. 16. A difference in height of the planarization layer $\Delta T6$ between the edge area and the area overlying the NVM gate structures using the low viscosity planarization material is less than the height difference $\Delta T5$ of the high viscosity planarization material. Thus, $\Delta T6 < \Delta T5$.

In embodiments of the disclosure, a single layer of the low viscosity planarization material is used instead of one or more layers of the high viscosity planarization material. The single layer of the low planarization material of this disclosure does not cause edge thinning like the high viscosity planarization material.

Figure 17:
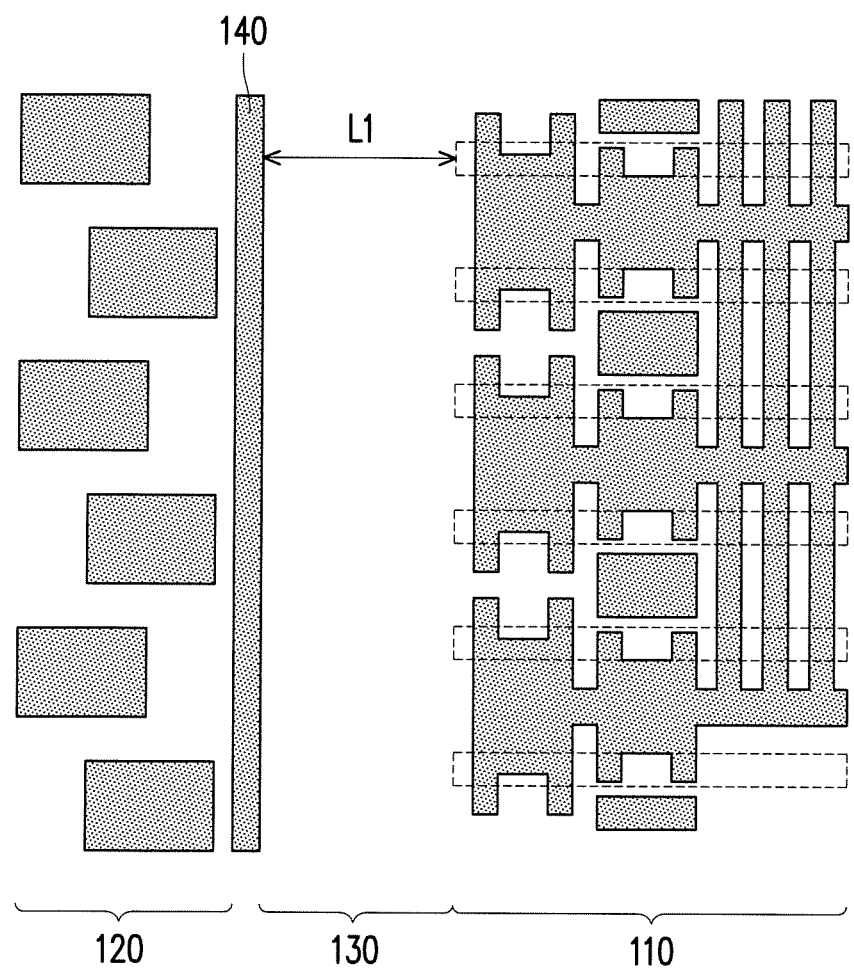
FIG. 17 shows a plan view of a non-volatile memory semiconductor device formed according to the present disclosure.

FIG. 17 shows a plan view of a non-volatile memory semiconductor device formed according to the present disclosure. The low viscosity planarization material used in the present disclosure, allows NVM semiconductor devices having reduced size to be formed. As shown in FIG. 17, in an embodiment of the present disclosure using the low viscosity planarization material the dummy area 130 between the logic area 120 and the cell area 110 spans a length L1. In some embodiments, the dummy area 130 having a width L1 surrounds the cell area. Some semiconductor devices are made with a dam structure surrounding the NVM cell area 110 of the non-volatile memory array edge to obviate high viscosity reflow problems. The dam structure increases the width L1 of the dummy area 130 surrounding the NVM cell area by the width of dam structure. Thereby, the overall size of a semiconductor device using a dam structure is increased by twice the width of the dam structure in both the X and Y directions as viewed in plan view. Thus, semiconductor devices according to the present disclosure using the low viscosity planarization material can be reduced in size by twice the width of the dam structure in both the X and Y direction as compared to a semiconductor device using a dam structure. In some semiconductor devices, a ground region 140 separates the NVM cell area 110 from the logic area 120. The ground region 140 can protect the semiconductor device from the deleterious effects of electrostatic discharge.

In some embodiments, the dummy area is reduced to about one-half the size of the dummy area of a non-volatile memory semiconductor device having a dam structure. Therefore, circuit density is increased in embodiments of the disclosure without array edge thinning. In some embodiments, the total area of the device according to the present disclosure is 10%-20% less than a device with a dam structure.

By using a low viscosity carbon backbone polymer as a bottom layer, a simplified process for planarizing a non-volatile memory cell is provided. In addition, the overall size of the non-volatile memory cell is decreased, as there is no space taken up by the dam structure. Furthermore, the manufacturing process is more efficient because to address high viscosity planarization material reflow problems, multiple application steps of the high planarization material may be necessary, each application taking time to apply and cure. According to the present disclosure, only one application of low viscosity planarization material is needed, therefore, the manufacturing process according to this disclosure eliminates the time required to apply and cure multiple layers.

Embodiments including NVM and logic regions of a semiconductor device are explained in the present disclosure, however the present disclosure is not limited to semiconductor devices including NVM and logic regions. The present disclosure is applicable to any situations where there are regions with substantial density or topography differences and a level/flat surface is required. For example, the methods of the present disclosure are applicable to semiconductor devices have a regions with different transistor densities.

The present disclosure is also applicable to mixed-signal system-on-a-chip which can be a combination of analog circuits, digital circuits, and intrinsic mixed-signal circuits. Mixed-signal integrated circuits contain both digital and analog circuits on the same chip, such as a microprocessor and an amplifier on the same chip. Mixed-signal integrated circuits are often used to convert analog signals to digital signals so that digital devices can process them. Examples of mixed-signal integrated circuits include data converters using delta-sigma modulation, analog-to-digital converter/digital-to-analog converter using error detection and correction, and digital radiochips. Digitally controlled sound chips are also mixed-signal circuits. Mixed signal chips such as these have regions of different topography and feature density. Improved planarization of these devices can be achieved using the techniques disclosed herein.

It will be understood that not all advantages have been necessarily discussed herein, no particular advantage is required for all embodiments or examples, and other embodiments or examples may offer different advantages.

An embodiment of the present disclosure is a method of manufacturing a non-volatile memory semiconductor device. The method includes forming a plurality of memory cells on a non-volatile memory cell area of a semiconductor substrate. A conductive layer is formed over the plurality of memory cells. A first planarization layer of a planarization material having a viscosity of less than about 1.2 centipoise is formed over the plurality of memory cells. A planarization operation is performed on the first planarization layer and the conductive layer, thereby removing an upper region of the first planarization layer and an upper region of the conductive layer. Portions of a lower region of the conductive layer between the memory cells are completely removed. In some embodiments, each memory cell includes first and second control gates with an erase gate in between the first and second control gates, first and second select gates located outside the first and second control gates, respectively, and first and second floating gates formed beneath the first and second control gates, respectively. In some embodiments, the method includes forming a hard mask layer on the plurality of memory cells before selectively removing portions of the lower region of the conductive layer between the memory cells. In some embodiments, the method includes forming a second planarization layer on the memory cells after forming the hard mask layer. In some embodiments, the method includes forming a photoresist layer on the second planarization layer. In some embodiments the method includes a dielectric layer disposed over the semiconductor substrate, and a ratio of a thickness T1 of the conductive layer of the third conductive layer measured at a flat surface from an upper surface of the dielectric layer to an uppermost surface of the third conductive layer to a thickness T2 of the conductive layer from an upper surface of the hard mask layer to an uppermost surface of the third conductive layer, T1/T2, ranges from about 10/1 to about 2/1. In some embodiments the method includes forming a logic area in a peripheral area of the semiconductor device spaced apart from then non-volatile memory cell area; and forming a ground region between the logic area and the cell area.

Another embodiment of the present disclosure is a method for manufacturing a semiconductor device including a non-volatile memory. The method includes forming, over a substrate, a stacked structure including: a first polysilicon layer disposed over a first dielectric layer, a second dielectric layer disposed over the first polysilicon layer, a second polysilicon layer disposed over the second dielectric layer, a cap insulating layer disposed over the second polysilicon layer, and sidewall spacers disposed on opposing sides of the first polysilicon layer, the second dielectric layer, the second polysilicon layer and the cap insulating layer. A third polysilicon layer is formed over the stacked structure, thereby covering the stacked structure. A first planarization layer of a planarization material having a viscosity of less than about 1.2 centipoise is formed over the third polysilicon layer. The first planarization layer and an upper portion of the third polysilicon layer is removed, thereby forming a select gate and an erase gate. In some embodiments, the first planarization material is an organic material. In some embodiments, a ratio of a thickness T3 of the first planarization layer as formed measured at a lower flat portion of the third polysilicon layer to a thickness T4 of the first planarization layer measured at an uppermost flat surface of the third polysilicon layer, T3/T4, ranges from about 15/1 to about 3/1. In some embodiments, the removing the first planarization layer and the upper portion of the third polysilicon layer includes performing a first etch-back operation using a first plasma process to partially remove the first planarization layer and the third polysilicon layer, thereby exposing the cap insulating layer; and performing a second etch-back operation using a second plasma process to further reduce a thickness of the third polysilicon layer, thereby forming the select gate and the erase gate. In some embodiments, the method includes forming a hard mask layer on the stacked structure after removing the first planarization layer and an upper portion of the third polysilicon layer. In some embodiments, the method includes forming a second planarization layer on the stacked structure after forming the hard mask layer. In some embodiments, the method includes forming a photoresist layer on the second planarization layer. In some embodiments, the method includes removing the photoresist layer, the second planarization layer, and the hard mask. In some embodiments, the first planarization layer and the second planarization layer are different materials.

Another embodiment of the present disclosure is a non-volatile memory semiconductor device, including a non-volatile memory cell area and a logic area. A dummy area is between the non-volatile memory cell area and the logic area, and a ground area is between the dummy area and the logic area. The dummy area does not contain a dam structure between the non-volatile memory cell area and the logic area. In some embodiments, the non-volatile memory cell area includes a plurality of non-volatile memory cells formed therein. In some embodiments, each memory cell includes first and second control gates with an erase gate in between the first and second control gates, first and second select gates located outside the first and second control gates, respectively, and first and second floating gates formed beneath the first and second control gates, respectively. In some embodiments, the logic area includes one or more gate electrode structures surrounded by an interlayer dielectric layer and separated by shallow trench isolation regions. In some embodiments, the floating gates and control gates include polysilicon. In some embodiments, the erase gate and the select gate comprise polysilicon. In some embodiments, the device includes a cap insulating layer overlying the control gates. In some embodiments, the cap insulating layer includes a first oxide layer overlying the control gate, a nitride layer overlying the first oxide layer, and a second oxide layer overlying the nitride layer. In some embodiments, the device includes a first sidewall spacer on sidewalls of the control gate and overlying the floating gate. In some embodiments, the first sidewall spacer includes a first oxide layer overlying the control gate, a nitride layer overlying the first oxide layer, and a second oxide layer overlying the nitride layer. In some embodiments, the device includes a second sidewall spacer on sidewalls of the first sidewall spacer and sidewalls of the floating gate.

Another embodiment of the present disclosure is a method for manufacturing a semiconductor device including a non-volatile memory. The method includes forming a first dielectric layer over a substrate. A first conductive film for a first conductive layer is formed over the first dielectric layer. A second dielectric film for a second dielectric layer is formed over the first conductive film. A second conductive film for a second conductive layer is formed over the second dielectric film. A third dielectric film for a cap insulating layer is formed over the second conductive film. The third dielectric film, the second conductive film, and the second dielectric film, are patterned thereby forming the cap insulating layer, the second conductive layer, and the second dielectric layer. After the cap insulating layer, the second conductive layer, and the second dielectric layer are formed, the first conductive film is patterned, thereby forming the first conductive layer and exposing a first portion of the first dielectric film. After the first conductive layer is formed and the first portion of the first dielectric film is exposed, first sidewall spacers are formed on opposing sides of the cap insulating layer, second conductive layer, second dielectric layer, and first conductive layer. A third conductive film for the third conductive layer is formed over the first exposed portion of the first dielectric film, the cap insulating layer, and the first sidewall spacers. A first planarization layer of a planarization material having a viscosity of less than about 1.2 centipoise is formed over the third conductive film, and the first planarization layer and an upper portion of the third conductive film are removed to form the third conductive layer, wherein the third conductive layer forms an erase gate and a select gate. In some embodiments, after the second conductive layer and the second dielectric layer are formed and before patterning the first conductive film, second sidewall spacers are formed on opposing sides of the cap insulating layer, second conductive layer, and second dielectric layer, wherein the first sidewall spacers are formed over the second sidewall spacers. In some embodiments, the removing the first planarization layer and an upper portion of the third conductive film includes performing a first etch-back operation using a first plasma process to partially remove the first planarization layer and the third conductive film, thereby exposing the cap insulating layer, and performing a second etch-back operation using a second plasma process to further reduce a thickness of the third conductive film to form the third conductive layer. In some embodiments, the method includes forming a hard mask layer on the cap insulating layer and the third conductive layer, forming a second planarization layer of the planarization layer material having a viscosity of less than about 1.2 centipoise on the hard mask layer, and patterning the second planarization layer, hard mask layer, and third conductive layer to expose a second portion of the first dielectric film.

Another embodiment of the present disclosure is a non-volatile memory semiconductor device structure, including a plurality of memory cell structures disposed on a substrate. Each memory cell structure includes first and second spaced apart floating gates disposed on the substrate, first and second spaced apart control gates disposed on first and second floating gates, respectively, a conductive layer disposed on and between a pair of adjacent memory cell structures, and a planarization layer disposed on the conductive layer. The planarization layer has a viscosity of less than about 1.2 centipoise. In some embodiments, the device structure includes a cap insulating layer overlying the control gates. In some embodiments, the cap insulating layer includes a first oxide layer overlying the control gates, a nitride layer overlying the first oxide layer, and a second oxide layer overlying the nitride layer. In some embodiments, the device structure includes a first sidewall spacer on sidewalls of the control gate and overlying the floating gate. In some embodiments, the first sidewall spacer includes a first oxide layer overlying the control gate, a nitride layer overlying the first oxide layer, and a second oxide layer overlying the nitride layer. In some embodiments, the device structure includes a second sidewall spacer on sidewalls of the first sidewall spacer and sidewalls of the floating gate.

Another embodiment of the present disclosure is a non-volatile memory semiconductor device structure, including a plurality of memory cell structures disposed on a substrate. Each memory cell structure includes first and second spaced apart floating gates disposed on the substrate, first and second spaced apart control gates disposed on first and second floating gates, respectively, an erase gate disposed between the first and second floating gates, a hard mask layer disposed on and between a pair of adjacent memory cell structures, and a planarization layer disposed on the hard mask layer. The planarization layer has a viscosity of less than about 1.2 centipoise. In some embodiments, the device structure includes a cap insulating layer overlying the control gates, wherein the cap insulating layer comprises a first oxide layer overlying the control gates, a nitride layer overlying the first oxide layer, and a second oxide layer overlying the nitride layer. In some embodiments, the device structure includes a first sidewall spacer on sidewalls of the control gate and overlying the floating gate, wherein the first sidewall spacer includes a first oxide layer overlying the sidewalls of the control gate, a nitride layer overlying the first oxide layer, and a second oxide layer overlying the nitride layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory semiconductor device, comprising:
    a non-volatile memory cell area;
    a logic area;
    a dummy area between the non-volatile memory cell area and the logic area,
    wherein the dummy area surrounds the non-volatile memory cell area; and
    a ground area configured to protect the semiconductor device from the deleterious effects of electrostatic discharge between the dummy area and the logic area,
    wherein the dummy area does not contain a dam structure between the non-volatile memory cell area and the logic area, and
    wherein each memory cell comprises:
    first and second control gates with an erase gate in between the first and second control gates,
    first and second select gates located outside the first and second control gates, respectively,
    first and second floating gates formed beneath the first and second control gates, respectively,
    three-layer first sidewall spacers comprising a nitride layer sandwiched by two oxide layers disposed alongside the first and second control gates,
    three-layer hard mask layers comprising a nitride layer sandwiched by two oxide layers disposed over a top surface surface of the first and second control gates, and
    second sidewall spacers disposed alongside the three-layer first sidewall spacers and the first and second floating gates.

2. The non-volatile memory semiconductor device of claim 1, wherein the non-volatile memory cell area comprises a plurality of non-volatile memory cells formed therein.

3. The non-volatile memory semiconductor device of claim 1, wherein the logic area comprises one or more gate electrode structures surrounded by an interlayer dielectric layer and separated by shallow trench isolation regions.

4. A method of manufacturing a non-volatile memory semiconductor device, comprising:
    forming a plurality of memory cells on a non-volatile memory cell area of a semiconductor substrate,
    forming a conductive layer over the plurality of memory cells;
    forming a first planarization layer of a planarization material over the plurality of memory cells;
    performing a planarization operation on the first planarization layer and the conductive layer, thereby removing an upper region of the first planarization layer and an upper region of the conductive layer;
    forming a hard mask layer on the plurality of memory cells; and
    forming a second planarization layer on the plurality of memory cells a forming the hard mask layer.

5. The method according to claim 4, wherein each memory cell comprises:
    first and second control gates with an erase gate in between the first and second control gates,
    first and second select gates located outside the first and second control gates, respectively, and
    first and second floating gates formed beneath the first and second control gates, respectively.

6. The method according to claim 4, further comprising forming a photoresist layer on the second planarization layer.

7. The method according to claim 6, further comprising removing the photoresist layer, the second planarization layer; and the hard mask layer.

8. The method according to claim 4, further comprising forming a dielectric layer over the substrate before forming the plurality of memory cells.

9. The method according to claim 8, wherein a ratio of a thickness T1 of the conductive layer measured at a flat surface from an upper surface of the dielectric layer to an uppermost surface of the conductive layer to a thickness T2 of the conductive layer from an upper surface of the hard mask layer to an uppermost surface of the third conductive layer, T1/T2, ranges from 10/1 to 2/1.

10. The method according to claim 4, further comprising:
    forming a logic area in a peripheral area of the semiconductor substrate spaced apart from the non-volatile memory cell area; and
    forming a ground region between the logic area and the memory cell area.

11. The method according to claim 4, wherein the first planarization material is an organic material.

12. The method according to claim 4, wherein the first planarization layer and the second planarization layer are different materials.

13. A method for manufacturing a semiconductor device including a non-volatile memory; the method comprising:

forming a first dielectric layer over a substrate;

forming a first conductive layer over the first dielectric layer;

forming a second dielectric layer over the first conductive layer;

forming a second conductive layer over the second dielectric layer;

patterning the first dielectric layer, the first conductive layer, the second dielectric layer, and the second conductive layer to form a plurality of stacked structures;

forming sidewall spacers on opposing sides of the plurality of stacked structures;

forming a third conductive layer over the plurality of stacked structures;

forming a first planarization layer of a planarization material over the third conductive layer;

forming a hard mask layer over the third conductive layer; and forming a second planarization layer over the plurality of stacked structures after forming the hard mask layer.

14. The method according to claim 13, wherein the first planarization material is an organic material.

15. The method according to claim 13, wherein the first planarization layer and the second planarization layer are different materials.

16. The method according to claim 13, wherein a ratio of a thickness T1 of the third conductive layer measured at a flat surface from an upper surface of the first dielectric layer to an uppermost surface of the third conductive layer to a thickness T2 of the third conductive layer from an upper surface of the hard mask layer to an uppermost surface of the third conductive layer, T1/T2, ranges from about 10/1 to about 2/1.

17. The method according to claim 13, wherein a ratio of a thickness T3 of the first planarization layer as formed measured at a lower flat portion of the third conductive layer to a thickness T4 of the first planarization layer measured at an uppermost flat surface of the third conductive layer, T3/T4, ranges from about 15/1 to about 3/1.

18. The method according to claim 13, further comprising:

performing a first etch-back operation using a first plasma process to partially remove the first planarization layer and the third conductive layer; and performing a second etch-back operation using a second plasma process to further reduce a thickness of the third conductive layer, thereby forming a select gate and an erase gate.

19. The method according to claim 18, further comprising forming a hard mask layer over the plurality of stacked structures after partially removing the first planarization layer and an upper portion of the third conductive layer.

20. The method according to claim 13, further comprising:

forming a logic area in a peripheral area of the semiconductor substrate spaced apart from the non-volatile memory cell; and forming a ground region between the logic area and the non-volatile memory cell.

* * * * *